United States Patent [19]
Yabe et al.

[11] Patent Number: 5,057,394
[45] Date of Patent: Oct. 15, 1991

[54] METHOD OF FORMING AN IMAGE

[75] Inventors: Norio Yabe, Higashi-matsuyama; Hideaki Sasaki, Moroyama; Kuniaki Monden, Sakado, all of Japan

[73] Assignee: Sanyo-Kokusaku Pulp Co., Ltd., Tokyo, Japan

[21] Appl. No.: 322,984

[22] Filed: Mar. 14, 1989

Related U.S. Application Data

[63] Continuation-in-part of Ser. No. 430,070, Nov. 1, 1989, which is a continuation of Ser. No. 120,546, Nov. 13, 1987, abandoned.

[51] Int. Cl.$^5$ .................... G03C 5/18; G03F 7/008; G03F 7/016
[52] U.S. Cl. .................... 430/145; 430/167; 430/175; 430/326; 430/910; 430/911
[58] Field of Search ............... 430/145, 274, 326, 175, 430/167, 911, 910

[56] References Cited

U.S. PATENT DOCUMENTS 2,544,877  3/1951  Bryce .................... 430/274
2,937,085  1/1974  Seven .................... 430/145
3,591,378  7/1971  Altman .................... 430/326
4,551,408  11/1985  Mino et al. .................... 430/145

Primary Examiner—Charles L. Bowers, Jr.
Assistant Examiner—John S. Y. Chu
Attorney, Agent, or Firm—Oblon, Spivak, McClelland, Maier & Neustadt

[57] ABSTRACT

Method of forming a positive-positive type image is disclosed, which is characterized in that a photosensitive layer is formed on a substrate using a composition comprising water-soluble photo-crosslinking agent, water-soluble resin and synthetic resin emulsion and further coloring agent, if necessary, said photosensitive layer is exposed to active rays through manuscript, then this is immersed into warm water of 30° to 60° C. for not less than 3 seconds to allow the exposed area to swell and soften sufficiently with warm water and simultaneously to allow almost all water-soluble photo-crosslinking agent in the nonexposed area to dissolve out into warm water, and successively the swollen and softened exposed area is rubbed out to form an image having no coloring originating from water-soluble photo-crosslinking agent without using the development chemicals except water.

2 Claims, No Drawings

METHOD OF FORMING AN IMAGE

This application is a continuation-in-part of application Ser. No. 07/430,070 filed Nov. 1, 1989, which in turn is a continuation of Ser. No. 07/120,546 filed Nov. 13, 1987, now abandoned.

BACKGROUND OF THE INVENTION

The present invention relates to a method of forming a positive-positive type image utilizable mainly for the printing plate-making material, duplicating material, etc. and, in more detail, relates to a method of forming an image having no coloring originating from water-soluble photo-crosslinking agent without using the development chemicals except water.

As the conventional positive-positive type photosensitive compositions and the methods of forming an image used these compositions, there have been, (1) System of a Composition Comprising O-Quinone Diazide Compound/Development With Alkali or Organic Solvent This is a composition comprising o-quinone diazide and alkali-soluble or organic solvent-soluble resin such as Novolak resin and, by utilizing a phenomenon that o-quinone diazide compound changes to an alkali-soluble substance or organic solvent-soluble substance through the photo-decomposition and by developing through the alkali-dissolution or organic solvent-dissolution, an image is formed (this can be found, for example, in Japanese Unexamined Patent Publication No. Sho 50-125806, Sho 61-5251, etc.).

(2) System of a Composition Comprising Photosensitive Diazonium Salt and Water-Soluble Resin/Development With Alkali or Ammonia This is a compound comprising photosensitive diazonium salt and water-soluble resins such as poly(vinyl alcohol), diacetone-acrylamide-acrylamide copolymer, etc. and, by utilizing a phenomenon that photo-sensitive diazonium salt and water-soluble resin give rise to the coupling reaction under alkaline atmosphere to be insolubilized into water, the non-image area is rubbed out to form an image after immersed into alkali solution or after touched with ammonia vapor (this can be found, for example, in Japanese Unexamined Patent Publication No. Sho 56-101141, Sho 56-101144, Sho 57-72140, Sho 57-191632, etc.).

With these conventional image-forming methods, however, there have been following problems. Namely, since alkali solution or organic solvent is used in (1) and alkali solution is used in (2), there are apprehensions to cause a problem on safety during the developing operation and a problem of pollution in the effluent treatment. Moreover, in (2), the development treatment with ammonia vapor is possible, but the intensive ammonia odor worsens significantly the environment of operation. Further, in the image formed in (1), the color of o-quinone diazide compound or decomposition products thereof is left behind and, in (2), there occurs an inherent coloring due to the coupling reaction. For these reasons, it is difficult to obtain colored images with arbitrary color in both (1) and (2), even if adding coloring agent.

The purpose of the invention is to provide a method of forming a positive-positive type image, wherein the image formation is possible by the treatment with warm water without using entirely the chemicals such as alkali, organic solvent, etc. and there are no coloring due to the photosensitive components or the decomposition products thereof and the color generation etc. caused by the image-forming reaction.

SUMMARY OF THE INVENTION

The gist of the invention lies in that a photosensitive layer is formed on a substrate using a composition comprising water-soluble photo-crosslinking agent, water-soluble resin and synthetic resin emulsion and further coloring agent, if necessary, said photosensitive layer is exposed to active rays through manuscript, then this is immersed into warm water of 30° to 60° C. for not less than 3 seconds to allow the exposed area to swell and soften sufficiently with warm water and simultaneously to allow almost all of water-soluble photo-crosslinking agent in the nonexposed area to dissolve out into warm water, and successively the swollen and softened exposed area is rubbed out to form an image having no coloring originating from water-soluble photo-crosslinking agent without using the development chemicals except water.

DETAILED DESCRIPTION OF THE INVENTION

As a result of diligent studies on a novel method of forming positive-positive type image possible to form an image without using entirely the chemicals such as alkali, organic solvent, etc., the inventors have found a phenomenon that the positive type photosensitive composition is obtained using the water-soluble photo-crosslinking agent (as shown, for example, in Japanese Patent Publication No. Sho. 44-28725) used hitherto for negative type photosensitive composition. Namely, the phenomenon to obtain a positive image by exposing to light the photosensitive layer formed on a supporter with a composition comprising water-soluble photo-crosslinking agent, water-soluble resin and synthetic resin emulsion through a positive image manuscript, by immersing it into warm water and by rubbing it with sponge has been found. Moreover, it is a special feature that the image thus obtained has almost no coloring due to the photosensitive components or no color generation accompanied with the image-forming reaction. The mechanism of this phenomenon is considered as follows:

Exposed Area

Exposed to active rays, the water-soluble photo-crosslinking agent and the water-soluble resin in the photosensitive layer are crosslinked. When immersing into warm water, this photo-crosslinking component swells easily to soften the photosensitive layer of this part. Also, the adhesiveness to the supporter is decreased. Consequently, this part is removed easily from supporter by rubbing with sponge etc.

Nonexposed Area

When immersing into warm water, most part of the water-soluble photo-crosslinking agent and the water-soluble resin in the photo-sensitive layer dissolve out, but the photosensitive layer shows no changes in the swelling, softening, etc. and the adhesiveness to the supporter also does not change. Consequently, the photo-sensitive layer is not removed from the supporter even if rubbed with sponge. Moreover, since most part of the water-soluble photo-crosslinking agent in the photosensitive layer dissolves out, the remaining photosensitive layer is colorless.

The invention provides the positive-positive type image-forming method utilized the phenomenon as described above.

As the water-soluble photo-crosslinking agents in the photo-sensitive compositions to be used for the image-forming method of the invention, water-soluble azide compounds, diazonium salts, tetrazonium salts and other publicly known organic photosensitive substances can be used. Exemplifying here several kinds thereamong, they are follows:

Water-Soluble Azide Compound

Sodium 4,4'-diazidostilbene-2,2'-disulfonate;
Sodium 4'-azido-4-azidobenzalacetophenone-2-sulfonate;
Sodium 4,4'-diazidostilbene-α-carboxylate;
Sodium di-(4-azido-2'-hydroxybenzal)acetone-2-sulfonate;
Sodium 4-azidobenzalacetophenone-2-sulfonate.

Diazo Resin

Condensate of p-diazodiphenylamine with formaldehyde.

Tetrazonium Salt

Diphenyl-4,4'-bisdiazonium chloride.zinc chloride double salt;
3,3'-Dimethyldiphenyl-4,4'-bisdiazonium chloride.zinc chloride double salt;
3,3'-Dimethoxydimethyl-4,4'-bisdiazonium chloride.zinc chloride double salt;
Diphenylamine-4,4'-bisdiazonium chloride.zinc chloride double salt;
Diphenylmethane-4,4'-bisdiazonium chloride.zinc chloride double salt.

As the water-soluble resins in the photosensitive compositions to be used for the image-forming method of the invention, a lot of compounds such as polyacrylamide, poly(vinyl-pyrrolidone), poly(vinyl alcohol), graft-polymerization products of poly(vinyl alcohol) with vinyl monomers, water-soluble poly(vinyl butyral), glue, casein, gelatin, arabic gum, egg albumin, gums, alginic acids, poly(ethylene oxide), poly(acrylic acid) and salts thereof, poly(methacrylic acid) and salts thereof, or mixtures of these, further mixtuers of these with poly(vinyl alcohol), cellulose derivatives such as carboxymethylcellulose, hydroxyethylcellulose, etc., and the like can be mentioned.

As the synthetic resin emulsions in the photosensitive compositions to be used for the image-forming method of the invention, a lot of compounds such as polyacrylate, ethylene-vinyl acetate copolymer, poly(vinylidene chloride), poly(vinyl acetate), poly(vinyl chloride), copolymers or mixtures of these, and the like can be mentioned.

Further, to the photosensitive compositions to be used for the image-forming method of the invention, water-dispersible colored pigments, water-soluble dyes, leveling agents, stabilizing agents, matting agents, etc., which are publicly known hitherto, can be added, if necessary.

The photosensitive composition to be used for the image-forming method of the invention comprises said water-soluble photo-crosslinking agent, water-soluble resin and synthetic resin emulsion. The formulation ratio in terms of solids of water-soluble resin to synthetic resin emulsion is 1:99 to 80:20, more preferably 5:95 to 40:60. If too much water-soluble resin is used, the water-resistance of image is decreased resulting in dropping out of image at the time of development and, if too much synthetic resin emulsion is used, the developability is decreased. If coming off seriously said range, the image cannot be obtained. Moreover, the formulation ratio in terms of solids of the sum of water-soluble resin and synthetic resin emulsion to water-soluble photo-crosslinking agent is 98:2 to 70:30, more preferably 96:4 to 80:20. If the water-soluble photo-crosslinking agent is less than this, the sensitivity and the image are lowered remarkably, and inversely, if it is too much, the quality of image is lowered. If coming off seriously said range, the image cannot be obtained. Furthermore, when adding the coloring agents, it is preferably for the colored pigment to be not more than 20% and for the water-soluble dye to be not more than 10% to the sum in solids of water-soluble photo-crosslinking agent, water-soluble resin and synthetic resin emulsion. Said components to constitute the photosensitive compositions are prepared by dissolving or dispersing them into water, water/alcohol mixture, etc.

The photosensitive composition prepared in this way and to be utilized for the image-forming method of the invention is coated onto the supporter to make the positive-positive type image-forming material. As the supporters, plastic films such as poly(ethylene terephthalate), polypropylene, polyethylene, poly(vinyl chloride), polystyrene, polycarbonate, triacetate, etc., glass plate, paper being made water-resistant by laminating with polyethylene, polypropylene or the like on both sides, and the like can be mentioned. Moreover, plastic films provided with the drawing quality such as sand-mat film treated one or both sides by sandblast method to give the writing quality with pencil, Japanese ink, ball pen, etc., etched mat film submitted to etching with alkali, and others, further opal films kneaded with white pigments, and the like can be used. Moreover, though the photosensitive layer may be coated directly onto said supporter, it is desirable to give beforehand the corona discharge treatment, primer coating or processing for adhesion combined these. As the primers, phenol resin, polyester resin, urethane resin, vinylidene chloride-vinyl acetate copolymer, vinylidene chlorideacrylonitrile copolymer and mixtures of these are used. The film thickness on the supporter is preferably to be 0.1 to 2.0 μm.

The coating onto the supporter is performed by arbitrary methods such as coating with rotary coater, roll coating, bar coating, brush coating etc. The coating weight is about 1 to 5 μm, preferably about 2 μm or so in the film thickness after drying. The thinner the film thickness, the better the resolution of image. After coating, the drying is made usually by hot air of less than about 90° C., but this may be air-drying.

According to the image-forming method of the invention, the positive-positive type image-forming material produced using said photosensitive composition is treated through following processes.

(1) Exposure to Light

The manuscript is superposed on the coated side with photosensitive composition of image-forming material produced and, to this, the active rays from various mercury-vapor lamps, carbon arc lamp, xenon lamp, metal halide lamp, UV fluorescent lamp, etc. are irradiated.

(2) Immersion into Warm Water

The image-forming material exposed to light is immersed into warm water to swell and soften the non-image area exposed to light and simultaneously to dissolve out the water-soluble photo-crosslinking agent in the image area not exposed to light into warm water. The temperature of warm water at this time is preferably to be 30° to 60° C. If using water of lower temperature than 30° C., the reproduction of fine lines, small half-tone dots, etc. is difficult because the exposed area does not swell and soften sufficiently. Also, if using water of higher temperature than 60° C., the quality of image obtained is lowered or the background contamination of non-image area due to the adhesion of the components of said photosensitive composition to the substrate takes place because the image area is also softened. Furthermore, when using high-temperature water, the environment of operation is worsened due to the vapor thereof. The immersion time into warm water is determined by the time to sufficiently swell the non-image area and the time to dissolve out the water-soluble photo-crosslinking agent in the image area into warm water, which necessitates not less than 3 seconds, more preferably not less than 10 seconds.

(3) Removal of Non-Image Area and Drying

The photosensitized surface of said image-forming material having finished the immersion into warm water is rubbed with sponge, brush, etc. to remove the non-image area. This operation may be carried out under any condition of being in water, in running water, in a vat without water, or the like, using said warm water or normal-temperature water. Then, drying is made.

In following, examples will be shown, but the invention is not confined to these.

EXAMPLE 1

A Liquor (Photosensitive Liquor)

| | |
|---|---|
| Diazo resin | 0.6 parts by wt. |
| (Condensate of p-diazodiphenylamine with formaldehyde) | |
| Denka size PC-100 | 1.5 parts by wt. |
| (Copolymer of vinyl alcohol with acrylamide, made by Denkikagaku Kogyo Co., Ltd.) | |
| Primal B-15 (46% liquor) | 15.7 parts by wt. |
| (Emulsion of polyacrylate, made by Nihon Acryl Kagaku Co., Ltd.) | |
| Carbon black dispersion | 5.0 parts by wt. |
| Methanol | 38.6 parts by wt. |
| Water | 38.6 parts by wt. |

However, the carbon black dispersion was obtained by dispersing for 3 hours with ink-mixing mill using a following formulation.

| | |
|---|---|
| Carbon black | 60 parts by wt. |
| Metholose 60SH 4000 | 10 parts by wt. |
| (Hydroxypropylmethylcellulose, made by Shinetsu Kagaku Co., Ltd.) | |
| Nonionic surfactant | 1 part by wt. |
| (Mixture of polyethyleneglycol alkylphenyl ether) | |
| Water | 229 parts by wt. |

A liquor was coated onto one side of poly(ethylene terephthalate) film with a thickness of 75 μm by the use of rotary coater and dried by warm air of 90° C. for 90 seconds to form the photo-sensitive layer with a thickness of 2 μm. Then, a positive manuscript with half-tone dots for printing was closely contacted with the photosensitive layer, which was exposed to light for 10 seconds from a distance of 1 m using 2 KW super high-pressure mercury-vapor lamp. This was immersed into warm water of 45° C. for 60 seconds to sufficiently swell the non-image area. Thereafter, by rubbing the photosensitized surface with sponge to remove the non-image area, a sharp black relief positive image with an optical density of 1.20 was obtained. This image reproduced the half-tone dots of 0.5–99.5% in manuscript.

COMPARATIVE EXAMPLE 1

The image-forming material being obtained in Example 1 and having finished the exposure to light was immersed into water of 15° C. for 60 seconds and thereafter the photosensitized surface was rubbed with sponge to remove the non-image area. In the positive image thus formed, the half-tone dots of smaller than 20% in manuscript were found not to be formed.

COMPARATIVE EXAMPLE 2

The image-forming material being obtained in Example 1 and having finished the exposure to light was immersed into warm water of 45° C. for 2 seconds and thereafter the photosensitized surface was rubbed with sponge to remove the non-image area. In the positive image thus formed, the half-tone dots of smaller than 10% in manuscript were found not to be formed.

EXAMPLE 2

B Liquor (Photosensitive Liquor)

| | |
|---|---|
| Sodium 4,4'-diazidostilbene-2,2'-disulfonate | 0.7 parts by wt. |
| PVP K-90 | 1.0 part by wt. |
| (Poly(vinyl-pyrrolidone), made by General Aniline & Film Corp.) | |
| Sumielite 1010 (50% liquor) | 10.7 parts by wt. |
| (Emulsion of ethylene-vinylchloride copolymer, Sumitomo Kagaku Kogyo Co., Ltd.) | |
| Methanol | 17.5 parts by wt. |
| Water | 70.1 parts by wt. |

Similarly to Example 1, B liquor was coated onto one side of poly(ethylene terephthalate) film with a thickness of 75 μm and dried to form the photosensitive layer with 2 μm. Then, this was exposed to light for 4 seconds at a distance of 1 m using 2 KW super high-pressure mercury-vapor lamp and immersed into warm water of 40° C. for 10 seconds to sufficiently swell the non-image area. Thereafter, when rubbing lightly the photo-sensitized layer in running water with sponge allowed to contain water, the non-image area exposed to light was removed to give a colorless positive relief image.

COMPARATIVE EXAMPLE 3

The image-forming material being obtained in Example 2 and having finished the exposure to light was immersed into water of 40° C. for 2 seconds and thereafter the photosensitized layer was rubbed lightly in running water with sponge allowed to contain water. At this time, an image close to one obtained in Example 2 was obtained, but the coloring due to the water-soluble photo-crosslinking agent was clearly seen in the image.

EXAMPLE 3

C Liquor (Photosensitive Liquor)

| | |
|---|---|
| 3,3'-Dimethoxydiphenyl-4,4'-bisdiazonium chloride-zinc chloride double salt | 1.5 parts by wt. |
| Polyacrylamide (10% aqueous solution) (Degree of polymerization 10000, made by Nakarai Kagaku) | 18.0 parts by wt. |
| Vinybrane 240 (45% liquor) (Vinyl chloride-based emulsion, made by Nisshin Kagaku Kogyo Co., Ltd.) | 8.0 parts by wt. |
| Carbon black dispersion | 6.5 parts by wt. |
| Methanol | 30.0 parts by wt. |
| Water | 36.0 parts by wt. |

C liquor was coated onto one side of poly(ethylene terephthalate) film with a thickness of 75 μm by the use of rotary coater and dried by warm air of 90° C. for 60 seconds to form the photosensitive layer with a thickness of 1.5 μm. Then, a positive manuscript was closely contacted with the photosensitive layer and exposed to light for 12 seconds from a distance of 1 m using 2 KW super high-pressure mercury-vapor lamp. This was immersed into warm water of 35° C. for 60 seconds to sufficiently swell the non-image area. Thereafter, when rubbing the photosensitized layer with sponge allowed to contain water to remove the non-image area, a sharp black relief positive image with an optical density of 0.85 was obtained.

EXAMPLE 4

D Liquor (Photosensitive Liquor)

| | |
|---|---|
| Sodium 4,4'-diazidostilbene-2,2'-disulfonate | 0.9 parts by wt. |
| PVP K-90 | 0.8 parts by wt. |
| Sumikaflex 830 (50% liquor) (Emulsion of vinyl acetate-ethylene-vinylchloride terpolymer, made by Sumitomo Kagaku Kogyo Co., Ltd.) | 16.4 parts by wt. |
| Carbon black dispersion | 5.0 parts by wt. |
| Methanol | 38.5 parts by wt. |
| Water | 38.5 parts by wt. |

D liquor was coated onto one side of poly(ethylene terephthalate) film with a thickness of 75 μm by the use of rotary coater and dried by warm air of 90° C. for 60 seconds to form the photosensitive layer with a thickness of 1.5 μm. Then, precoat-control wedge UGRA PCW 82 (made by Mika Denshi Co., Ltd.) was closely contacted with the photosensitive layer and exposed to light for 12 seconds from a distance of 1 m using 2 KW super high-pressure mercury-vapor lamp. This was immersed into warm water of 40° C. for 30 seconds to sufficiently swell the non-image area. Thereafter, when rubbing the photosensitized layer in running water with sponge allowed to contain water ot remove the non-image area, a sharp black relief positive image with an optical density of 1.0 was obtained. The image thus formed reproduced fine lines of 6 μm and half-tone dots of 0.5-99.5%.

COMPARATIVE EXAMPLE 4

The image-forming material being obtained in Example 4 and having finished the exposure to light was immersed into water of 20° C. for 30 seconds and thereafter the photosensitized surface was rubbed in running water with sponge allowed to contain water to remove the non-image area. At this time, image portion with half-tone dots of smaller than 30% could not be formed.

What is claimed is:

1. A method for forming a positive-type image characterized in that a photosensitive layer is formed on a substrate using a composition comprising water-soluble photo-crosslinking agent selected from the group consisting of a water-soluble azide compound, diazonium salt and tetrazonium salt, water-soluble resin and synthetic resin emulsion, exposing said photosensitive layer to active rays through a positive manuscript, then immersing said layer into warm water for not less than 3 seconds to allow the exposed area to swell and soften sufficiently with warm water and simultaneously to allow almost all of water-soluble photo-crosslinking agent in the nonexposed are to dissolve out into warm water, and successively rubbing out the swollen and softened exposed area to form a positive image having no coloring originating from the water-soluble photo-crosslinking agent using only warm water having a temperature of 30° to 60° C. as the development chemical.

2. The method according to claim 1, wherein the photosensitive layer additionally contains a coloring agent.

* * * * *